United States Patent [19]
Hoshino et al.

[11] Patent Number: 5,469,397
[45] Date of Patent: Nov. 21, 1995

[54] SEMICONDUCTOR MEMORY DEVICE WITH A REFERENCE POTENTIAL GENERATOR

[75] Inventors: Chiaki Hoshino, Yokohama; Norihisa Arai, Oomiya, both of Japan

[73] Assignee: Kabushiki Kaisha Toshiba, Kawasaki, Japan

[21] Appl. No.: 337,209

[22] Filed: Nov. 8, 1994

[30] Foreign Application Priority Data

Dec. 21, 1993 [JP] Japan .................... 5-322430

[51] Int. Cl.$^6$ .................................. G11C 7/02
[52] U.S. Cl. ............. 365/210; 365/189.09; 365/185.13
[58] Field of Search ........................... 365/185, 210, 365/189.09, 189.07, 230.04, 207

[56] References Cited

U.S. PATENT DOCUMENTS 4,799,196  1/1989  Takemae .................... 365/149
5,258,959 11/1993  Dallabora et al. .......... 365/210

*Primary Examiner*—Joseph A. Popek
*Assistant Examiner*—A. Zarabian
*Attorney, Agent, or Firm*—Banner & Allegretti Ltd.

[57] ABSTRACT

The memory cells connected to the word lines in the odd-numbered rows differ from the memory cells connected to the word lines in the even-numbered rows in characteristics. A dummy cell DMC1 has the same characteristics as those of the memory cells connected to the word lines in the odd-numbered rows, and a dummy cell DMC2 has the same characteristics as those of the memory cells connected to the word lines in the even-numbered rows. Because the dummy cell DMC1 is selected together with a word line in an odd-numbered row, and the dummy cell DMC2 is selected together with a word line in an even-numbered row, a suitable reference potential can be supplied in accordance with the selected memory cell. A sense amplifier compares the potential on the bit line to which the selected memory cell is connected with the potential supplied from the selected dummy cell. Therefore, the sense amplifier can sense the potential at the selected memory cell accurately.

8 Claims, 2 Drawing Sheets

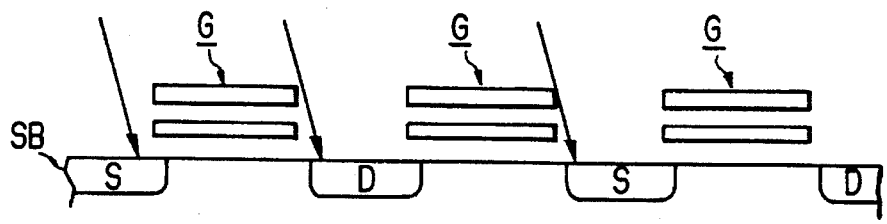
FIG. 2
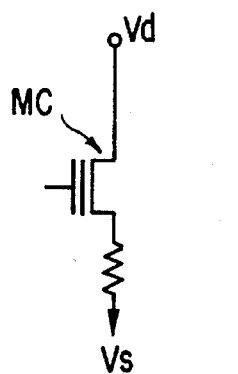
FIG. 3A    FIG. 3B
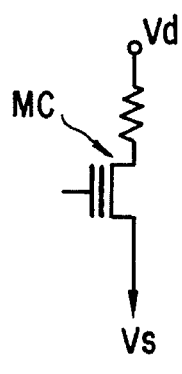
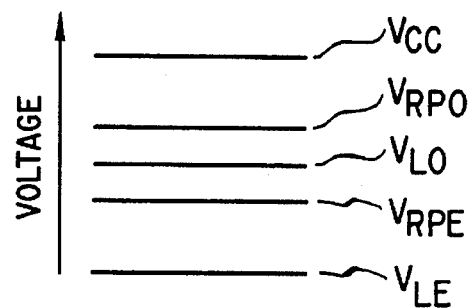
FIG. 4
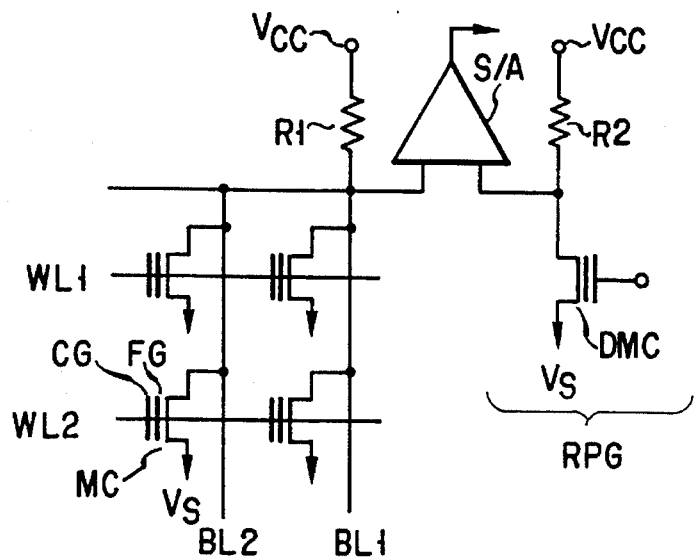
FIG. 5  (PRIOR ART)

SEMICONDUCTOR MEMORY DEVICE WITH A REFERENCE POTENTIAL GENERATOR

BACKGROUND OF THE INVENTION

1. Field of the Invention

This invention relates to, for example, a nonvolatile semiconductor memory device, and more particularly to a semiconductor memory device with a reference potential generator for generating a reference potential.

2. Description of the Related Art

FIG. 5 is a schematic circuit diagram of a nonvolatile semiconductor memory, such as an EPROM (Erasable Programmable ROM). A memory cell MC contains a floating gate FG and a control gate CG. Memory cells MC of this type are arranged in a matrix. The control gates CG of the individual memory cells MC are connected to word lines WL1, WL2, . . . , their sources are connected to a power supply Vs, and their drains are connected to bit lines BL1, BL2 . . . The individual bit lines BL1, BL2 . . . are connected to a power supply Vcc via a select transistor (not shown) and a resistor R1, as well as to one input terminal of a sense amplifier S/A.

Connected to the other input terminal of the sense amplifier S/A is a reference potential generator circuit RPG composed of a dummy cell DMC and a resistor R2. The dummy cell DMC has the same structure as that of the memory cell MC, and its drain is connected to the other input terminal of the sense amplifier S/A. One terminal of the resistor R2 is connected to the other input terminal of the sense amplifier S/A, and the other terminal of resistor R2 is connected to power supply Vcc. The resistance of the resistor R2 is set at half of the resistance of resistor R1. The potential on the bit line may be either at a high level where "0" data is written into a memory cell, preventing a cell current from flowing, or at a low level where no "0" is written in a memory cell, permitting a cell current to flow. In the reference potential generator circuit RPG, the dummy cell DMC and resistor R2 generate an intermediate potential between the high-level and the low level bit-line potential as a reference potential. The sense amplifier S/A senses data by comparing a bit-line potential with the reference potential according to the data stored in the memory cell selected.

The source and drain of the memory cell are formed by implanting ionized impurities into a substrate SB using a gate electrode G including the control gate CG and floating gate FG as a mask. However, it is difficult to implant ions at right angles with all of the memory cells because of the structure of the ion-implantation machine. In the case of some types of ions, to prevent channeling, ions may be implanted at a specified angle. During ion implantation, when the implantation angle is not at right angles to the substrate SB, shadowing will take place due to the gate electrode G. This makes the source S and drain D formed on both sides of the gate electrode G asymmetrical with respect to the gate electrode G, making the source S and drain D different in size from each other. As a result, the memory cells connected to the word lines in the odd-numbered rows differ from those connected to the word lines in the even-numbered rows in the equivalent circuit, resulting in the difference in cell current between them. Therefore, when a memory cell in which no data is written is selected, the cell current differs, depending on whether the memory cell is connected to a word line in an odd-numbered row or in an even-numbered row.

The reference potential is generated by one dummy cell DMC and resistor R2 as mentioned earlier, and is determined by the characteristics of the dummy cell DMC. Since the dummy cell DMC is formed through the same manufacturing processes as those of memory cells, it has the same configuration as that of the memory cells connected to the word line in the odd-numbered row or in the even-numbered row as described above. Therefore, in sensing data, the dummy cell DMC was able to give a suitable reference potential to either the memory cells connected to a word line in an odd-numbered row or the memory cells connected to a word line in an even-numbered row, but was unable to give a suitable reference potential to the other memory cells. As a result, the sense amplifier S/A was unable to sense the potential on the bit line accurately.

SUMMARY OF THE INVENTION

It is, accordingly, an object of the present invention to overcome the disadvantages described above by providing a semiconductor memory device which can prevent the reference potential from varying, depending on whether the word line is in an odd-numbered row or in an even-numbered row, and sense the potential on the bit line accurately.

The foregoing object is accomplished by providing a semiconductor memory device comprising: a plurality of memory cells arranged in a matrix, each memory cell containing a source region, a drain region, and a gate, and the characteristics of the memory cells in the odd-numbered rows differing from those of the memory cells in the even-numbered rows; a plurality of word lines for connecting the gates of the memory cells in the odd-numbered rows among the memory cells; a plurality of word lines for connecting the gates of the memory cells in the even-numbered rows among the memory cells; a plurality of bit lines to each of which one end of the current path of each of the memory cells is connected; selecting means for selecting one bit line from these bit lines; a first dummy cell whose characteristics are the same as those of the memory cells in the odd-numbered rows and which is selected together with the memory cells in an odd-numbered row and generates a first reference potential; a second dummy cell whose characteristics are the same as those of the memory cells in the even-numbered rows and which is selected together with the memory cells in an even-numbered row and generates a second reference potential; and sensing means to one input terminal of which the bit line selected by the selecting means is connected, and to the other input terminal of which the first and second dummy cells are connected, and which senses the potential on the bit line by using one of the first and the second reference potential generated by the first and the second dummy cell.

With this invention, the first dummy cell has the same characteristics as those of the memory cells in the odd-numbered rows, is selected together with the memory cells in an odd-numbered row, and generates a first reference potential. The second dummy cell has the same characteristics as those of the memory cells in the even-numbered rows, is selected together with the memory cells in an even-numbered row, and generates a second reference potential. Therefore, even when the memory cells in the odd-numbered rows differ from the memory cells in the even-numbered rows in characteristics, a suitable reference potential can be generated in accordance with the selected memory cell. This enables the sensing means to accurately sense the potential on the selected bit line on the basis of the suitable reference potential.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a sectional view to help explain the difference in characteristics between memory cells;

FIGS. 3A and 3B are equivalent circuit diagrams of the memory cell shown in FIG. 2;

FIG. 4 is a diagram to help explain the operation in FIG. 1; and

FIG. 5 is a circuit diagram of a conventional semiconductor memory device.

DETAILED DESCRIPTION OF THE PREFERRED EMBODIMENTS

Figure 1:
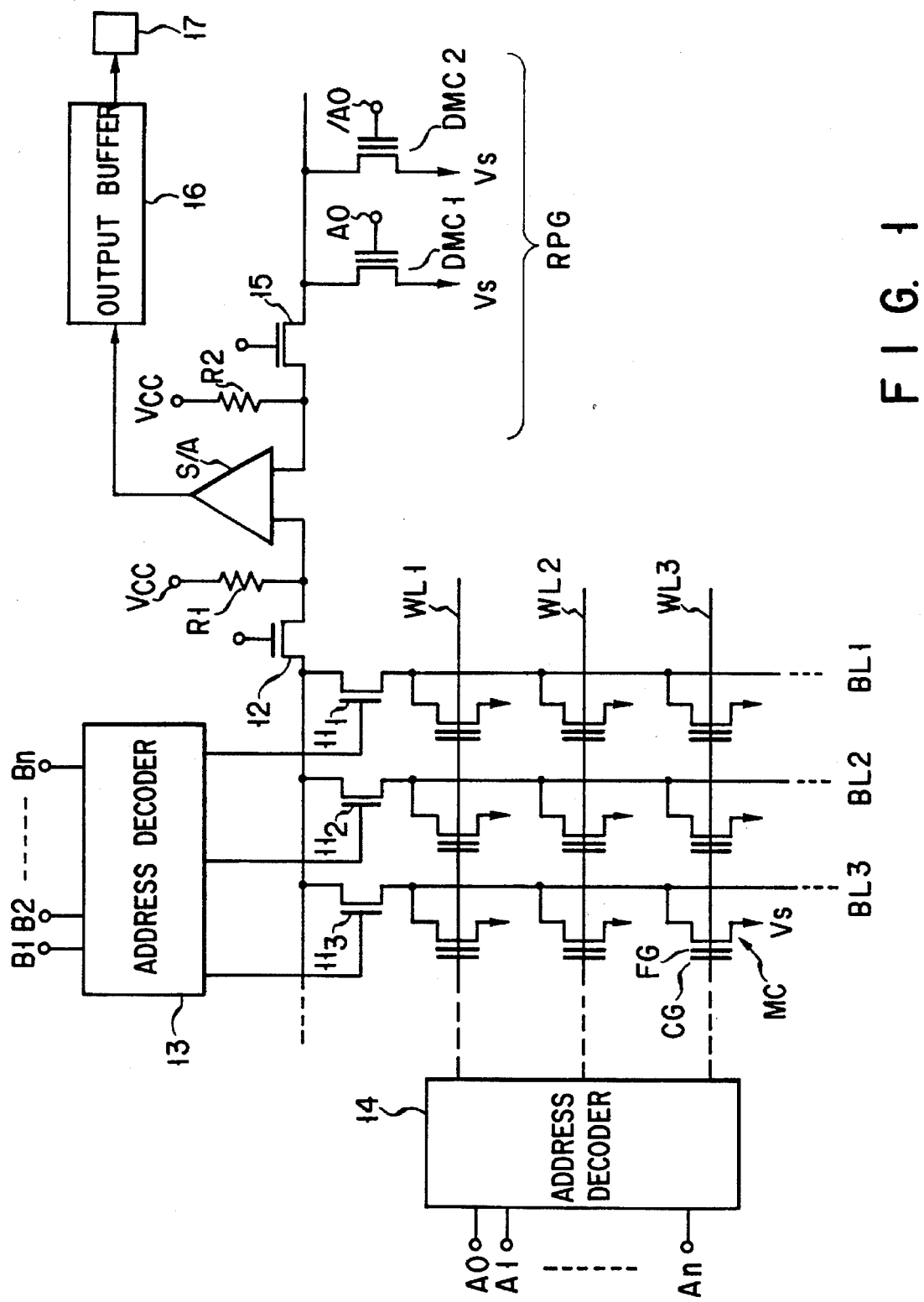
FIG. 1 is a circuit diagram of an embodiment of the present invention.

Hereinafter, referring to the accompanying drawings, an embodiment of the present invention will be explained.

FIG. 1 shows a case where the invention is applied to an EPROM, for example. In FIG. 1, a transistor constituting a memory cell MC contains a floating gate FG and a control gate CG. Memory cells of this type are arranged in a matrix. The control gates CG of the individual memory cells are connected to word lines WL1, WL2, WL3, . . . , their sources are connected to a power supply Vs, and their drains are connected to bit lines BL1, BL2, BL3, . . . one end of each of bit lines BL1, BL2, BL3, . . . is connected to the source of each of select transistors $11_1$, $11_2$, $11_3$, . . . , respectively. The gates of these select transistors $11_1$, $11_2$, $11_3$, . . . are connected to an address decoder 13, and word lines WL1, WL2, WL3 . . . are connected to an address decoder 14. The drains of these select transistors $11_1$, $11_2$, $11_3$, . . . are connected to the source of a transistor 12, whose drain is connected to a power supply Vcc via a resistor R1 as well as to one input terminal of a sense amplifier S/A. Connected to the other input terminal of the sense amplifier S/A is a reference potential generator circuit RPG composed of dummy cells DMC1 and DMC2, a resistor R2, and a transistor 15.

The dummy cell DMC1 has the same shape and characteristics as those of the memory cells MC connected to word lines WL1, WL3, . . . in the odd-numbered rows, for example. The control gate of the dummy cell DMC1 is supplied with an address signal AO, for example. The dummy cell DMC2 has the same shape and characteristics as those of the memory cells MC connected to word lines WL2, . . . in the even-numbered rows, for example. The control gate of the dummy cell DMC2 is supplied with an inverted address signal /AO, for example. The sources of these dummy cells DMC1 and DMC2 are connected to the power supply Vs, and their drains are connected to the source of the transistor 15. The drain of the transistor 15 is connected to the power supply Vcc via the resistor R2 as well as to the other input terminal of the sense amplifier S/A. The output terminal of the sense amplifier S/A is connected to an output pad 17 via an output buffer 16.

The source and drain of each of memory cells MC, dummy cell DMC1, and DMC2 are formed by implanting ionized impurities into a substrate SB, using a gate electrode including the control gate CG and floating gate FG as a mask, as shown in FIG. 2. As mentioned earlier, because of the configuration of the ion-implantation machine, it is difficult to implant ions into all of the memory cells at right angles. In the case of some types of ions, ions may be implanted at a specified angle to prevent channeling. This makes the source S and drain D formed on the respective sides of the gate electrode G asymmetrical with respect to the gate electrode G, making the source S and drain D different in size from each other. As a result, the memory cells connected to the word lines in the odd-numbered rows differ from those connected to the word lines in the even-numbered rows in the equivalent circuit, resulting in the difference in cell current between them, as shown in FIGS. 3A and 3B. Therefore, when a memory cell in which no data is written is selected, the cell current differs, depending on whether the memory cells are connected to a word line in an odd-numbered row or in an even-numbered row. The dummy cells DMC1 and DMC2 have equivalent circuits as shown in FIGS. 3A and 3B, respectively.

With the above configuration, when the address decoder 14 selects any one of word lines WL1, WL3 . . . in the odd-numbered rows, the dummy cell DMC1 is also selected at the same time; when the address decoder 14 selects any one of word lines WL2 . . . in the even-numbered rows, the dummy cell DMC2 is also selected simultaneously. The resistance of the resistor R2 is set at half of the resistance of the resistor R1. Therefore, when a word line in an odd-numbered row is selected together with dummy cell DMC1, the reference potential generator circuit RPG generates an intermediate potential between the high-level Vcc and a low level $V_{LO}$ on a bit line changing in accordance with the data stored in the memory cell as a reference potential V PRO, as shown in FIG. 4. In addition, when a word line in an even-numbered row is selected together with dummy cell DMC2, the reference potential generator circuit RPG generates an intermediate potential between the high-level vcc and a low level $V_{LE}$ on a bit line changing in accordance with the data stored in the memory cell as a reference potential $V_{PRE}$, as shown in FIG. 4.

The sense amplifier S/A senses data by comparing the bit-line potential whose level varies depending on the data stored in the selected memory cell with the reference potential. Specifically, in a read operation, with transistors 12 and 15 conductive, when any one of word lines WL1, WL3, . . . in the odd-numbered rows is selected, and any one of select transistors $11_1$, $11_2$, $11_3$, . . . is selected, the sense amplifier compares the potential on the selected bit line with the reference potential $V_{PRO}$ outputted from the reference potential generator circuit RPG, and outputs the comparison result to the output pad 17 via the output buffer 16. In addition, when any one of word lines WL2, . . . in the even-numbered rows is selected, the sense amplifier compares the potential on the selected bit line with the reference potential $V_{PRE}$ outputted from the reference potential generator circuit RPG, and outputs the comparison result to the output pad 17 via the output buffer 16.

In the embodiment, the reference potential generator circuit RPG contains the dummy cell DMC1 that has the same shape and characteristics as those of the memory cells in the odd-numbered rows and the dummy cell DMC2 that has the same shape and characteristics as those of the memory cells in the even-numbered rows. When a memory cell in an odd-numbered row is selected, the dummy cell DMC1 is also selected simultaneously; when a memory cell in an even-numbered row is selected, the dummy cell DMC2 is also selected simultaneously. Therefore, even when the characteristics of the memory cell in the odd-numbered row differ from those of the memory cell in the even-numbered row, an optimum reference potential can be set on the memory cells in each row, thereby improving the operating margin and consequently sensing the data stored in the selected memory cell reliably.

While in the embodiment, an EPROM is used as an example, the invention is not restricted to this. For instance, the invention may be applied to an EEPROM (Electrically Erasable Programmable ROM) or a flash EEPROM.

What is claimed is:

1. A semiconductor memory device comprising:

a plurality of memory cells arranged in a matrix, each memory cell containing a source region, a drain region, and a gate, and the characteristics of the memory cells in odd-numbered rows differing from those of the memory cells in even-numbered rows;

a plurality of word lines for connecting the gates of the memory cells fin the odd-numbered rows among said memory cells;

a plurality of word lines for connecting the gates of the memory cells in the even-numbered rows among said memory cells;

a plurality of bit lines to each of which one end of a current path of each of said memory cells is connected;

selecting means for selecting one bit line from these bit lines;

a first dummy cell whose characteristics are the same as those of said memory cells in the odd-numbered rows and which is selected together with said memory cells in an odd-numbered row and generates a first reference potential;

a second dummy cell whose characteristics are the same as those of said memory cells in the even-numbered rows and which is selected together with said memory cells in an even-numbered row and generates a second reference potential; and sensing means to one input terminal of which said bit line selected by said selecting means is connected, and to another input terminal of which said first and second dummy cells-are connected, and which senses a potential on said bit line by using one of the first and the second reference potential generated by the first and the second dummy cell.

2. A semiconductor memory device according to claim 1, wherein each of said memory cells is a nonvolatile semiconductor memory containing a floating gate and a control gate.

3. A semiconductor memory device according to claim 1, wherein the source and drain regions of said memory cells in the odd-numbered rows differ from those of said memory cells in the even-numbered rows in size.

4. A semiconductor memory device according to claim 1, wherein the amount of current flowing in said memory cells in the odd-numbered rows differs from that of current flowing in said memory cells in the even-numbered rows.

5. A semiconductor memory device comprising:

a plurality of memory cells arranged in a matrix, each memory cell containing a source region and a drain region, and source and drain regions of the memory cells in odd-numbered rows differing from those of said memory cells in even-numbered rows in size;

a plurality of first word lines for connecting the gates of the memory cells in the odd-numbered rows among said memory cells;

a plurality of second word lines for connecting the gates of the memory cells in the even-numbered rows among said memory cells;

a plurality of bit lines to each of which one end of a current path of each of said memory cells is connected;

selecting means for selecting one bit line from these bit lines;

a first dummy cell whose source and drain regions are of the same size as those of said memory cells in the odd-numbered rows and which is selected together with said memory cells in an odd-numbered row and generates a first reference potential;

a second dummy cell whose source and drain regions are of the same size as those of said memory cells in the even-numbered rows and which is selected together with said memory cells in an even-numbered row and generates a second reference potential; and sensing means to one input terminal of which said bit line selected by said selecting means is connected, and to another input terminal of which said first and second dummy cells are connected, and which senses a potential on said bit line by using one of the first and the second reference potential generated by the first and the second dummy cell.

6. A semiconductor memory device according to claim 5, wherein each of said memory cells is a nonvolatile semiconductor memory containing a floating gate and a control gate.

7. A semiconductor memory device comprising:

a plurality of memory cells arranged in a matrix, each memory cell containing a source region and a drain region, and the amount of current flowing in said memory cells in odd-numbered rows differing from that of current flowing in said memory cells in even-numbered rows;

a plurality of first word lines for connecting gates of the memory cells in the odd-numbered rows among said memory cells;

a plurality of second word lines for connecting gates of the memory cells in the even-numbered rows among said memory cells;

a plurality of bit lines to each of which one end of a current path of each of said memory cells is connected;

selecting means for selecting one bit line from these bit lines;

a first dummy cell which carries the same amount of current as that in said memory cells in the odd-numbered rows and which is selected together with said memory cells in an odd-numbered row and generates a first reference potential;

a second dummy cell which carries the same amount of current as that in said memory cells in the even-numbered rows and which is selected together with said memory cells in an even-numbered row and generates a second reference potential; and sensing means to one input terminal of which said bit line selected by said selecting means is connected, and to another input terminal of which said first and second dummy cells are connected, and which senses a potential on said bit line by using one of the first and the second reference potential generated by the first and the second dummy cell.

8. A semiconductor memory device according to claim 7, wherein each of said memory cells is a nonvolatile semiconductor memory containing a floating gate and a control gate.

* * * * *